(12) United States Patent
Ohno et al.

(10) Patent No.: US 12,002,858 B2
(45) Date of Patent: Jun. 4, 2024

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Tetsuya Ohno, Yokohama Kanagawa (JP); Akira Yoshioka, Yokohama Kanagawa (JP); Toru Sugiyama, Musashino Tokyo (JP); Hung Hung, Kawasaki Kanagawa (JP); Yasuhiro Isobe, Ota Tokyo (JP); Hitoshi Kobayashi, Yamato Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 83 days.

(21) Appl. No.: 17/191,554

(22) Filed: Mar. 3, 2021

(65) Prior Publication Data

US 2022/0093747 A1   Mar. 24, 2022

(30) Foreign Application Priority Data

Sep. 24, 2020 (JP) .................. 2020-159720

(51) Int. Cl.
*H01L 29/20* (2006.01)
*H01L 29/06* (2006.01)
(Continued)

(52) U.S. Cl.
CPC ...... *H01L 29/2003* (2013.01); *H01L 29/0607* (2013.01); *H01L 29/404* (2013.01);
(Continued)

(58) Field of Classification Search
CPC . H01L 23/28; H01L 23/3171; H01L 23/3192; H01L 29/122–127;
(Continued)

(56) References Cited

U.S. PATENT DOCUMENTS 11,043,563 B2 * 6/2021 Lin .................. H01L 29/66462
11,152,474 B1 * 10/2021 Chen ................ H01L 29/41775
(Continued)

FOREIGN PATENT DOCUMENTS

CN       110071173 A    7/2019
JP     2007-537594 A   12/2007
(Continued)

OTHER PUBLICATIONS

Zhang et al., Semiconductor device and manufacturing method thereof, 2020, CN-202010499349.X, pp. 1-37. (Year: 2020).*
(Continued)

*Primary Examiner* — Natalia A Gondarenko
(74) *Attorney, Agent, or Firm* — Kim & Stewart LLP

(57) ABSTRACT

A semiconductor device has a first and a second nitride semiconductor layer and a first and a second electrode thereon. A gate electrode is between the first and second electrodes. A gate field plate is on the gate electrode. A first field plate is above a position between the gate field plate and the second electrode. A second field plate is between the first field plate and the gate field plate. A distance from the first nitride semiconductor layer to the second field plate is shorter than a distance from the first nitride semiconductor layer to the portion of the gate field plate that protrudes the most towards the second electrode. The distance from the first nitride semiconductor layer to the second field plate is shorter than a distance from the first nitride semiconductor layer to an end surface of the first field plate on a first electrode side.

20 Claims, 2 Drawing Sheets

(51) Int. Cl.
*H01L 29/40* (2006.01)
*H01L 29/423* (2006.01)
*H01L 29/778* (2006.01)

(52) U.S. Cl.
CPC ........ *H01L 29/407* (2013.01); *H01L 29/4236* (2013.01); *H01L 29/7786* (2013.01)

(58) Field of Classification Search
CPC ....... H01L 29/15–158; H01L 29/42316; H01L 29/6656; H01L 29/66431; H01L 29/66462; H01L 29/6653; H01L 29/66719; H01L 29/778–7789; H01L 29/7816; H01L 29/808; H01L 21/02183; H01L 21/02164; H01L 21/0228; H01L 21/02274; H01L 21/02107; H01L 21/02112; H01L 21/022; H01L 21/022; H01L 21/802205; H01L 2924/13064; H01L 21/02225; H01L 21/0229; H01L 21/2123; H01L 21/0217; H01L 21/28114; H01L 21/823468; H01L 21/823864; H01L 21/823456; H01L 21/82385; H01L 29/2003; H01L 29/0607; H01L 29/404; H01L 29/407; H01L 29/4236; H01L 29/7786; H01L 29/7787; H01L 29/0611; H01L 29/0684
USPC .................... 257/76, 77, 183, 190, 194, 192
See application file for complete search history.

(56) References Cited

U.S. PATENT DOCUMENTS

| | | |
|---|---|---|
| 2005/0253168 A1 | 11/2005 | Wu et al. |
| 2006/0202272 A1 | 9/2006 | Wu et al. |
| 2012/0126287 A1* | 5/2012 | Aoki .................... H01L 29/7787 257/192 |
| 2013/0083567 A1* | 4/2013 | Imada ............... H01L 29/66462 257/192 |
| 2019/0280092 A1 | 9/2019 | Lin et al. |
| 2020/0350399 A1 | 11/2020 | Wong |
| 2021/0043724 A1* | 2/2021 | Wu ........................ H01L 29/432 |
| 2021/0151571 A1* | 5/2021 | Chou ................. H01L 29/66462 |
| 2021/0384303 A1* | 12/2021 | Zhang ................. H01L 21/7605 |

FOREIGN PATENT DOCUMENTS

| | | |
|---|---|---|
| JP | 2012178595 A | 9/2012 |
| JP | 2015-170821 A | 9/2015 |

OTHER PUBLICATIONS

Notice of Reasons for Refusal dated Aug. 29, 2023 in corresponding Japanese Patent Application No. 2020-159720, 12 pages (with Translation).

Notice of Reasons for Refusal mailed Jan. 30, 2024 in corresponding Japanese Patent Application No. 2020-159720, 11 pages (with Translation).

* cited by examiner

SEMICONDUCTOR DEVICE

CROSS-REFERENCE TO RELATED APPLICATION

This application is based upon and claims the benefit of priority from Japanese Patent Application No. 2020-159720, filed Sep. 24, 2020, the entire contents of which are incorporated herein by reference.

FIELD

Embodiments described herein relate generally to a semiconductor device.

BACKGROUND

Semiconductor circuit elements such as transistors and diodes are used in switching power source circuits and invertor circuits, for example. These semiconductor circuit elements require high breakdown voltages and low on-state resistances. Between breakdown voltage and on-state resistance, there is a tradeoff relationship related to the composition of materials used in circuit elements.

Owing to progress in technical development, the semiconductor circuit elements have on-state resistance nearing the limit of silicon-based materials. In order to further improve the breakdown voltage and further decrease the on-state resistance, there is need to change circuit element materials. When nitride semiconductors such as gallium nitride and aluminum gallium nitride are used as element materials of a semiconductor element, the tradeoff relationship can be improved. This makes it possible to notably increase the breakdown voltage and decrease the on-state resistance of the semiconductor circuit elements.

Field plate electrodes are also incorporated to reduce electric field concentration in the transistors made of nitride semiconductors. However, even with field plate electrodes, electric field concentration may cause an interlayer insulating film to be broken in some cases.

DETAILED DESCRIPTION

Figure 1:
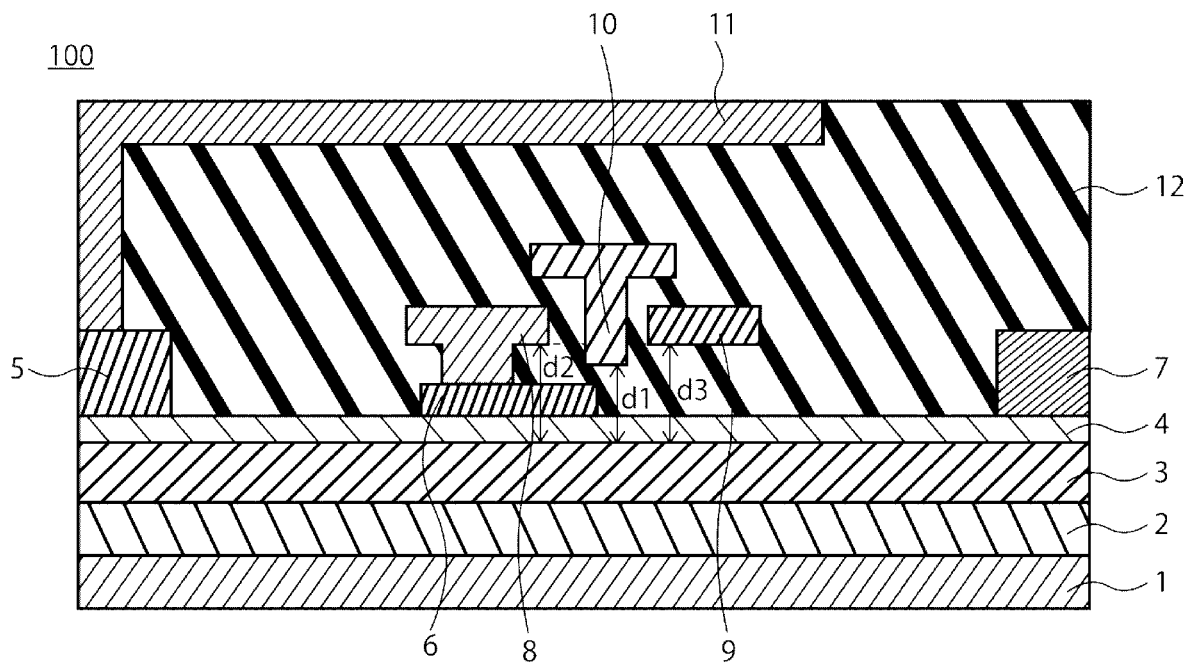
FIG. 1 is a schematic cross-sectional view of a semiconductor device according to an embodiment.

Embodiments provide a highly reliable semiconductor device. In general, according to one embodiment, a semiconductor device includes a first nitride semiconductor layer, a second nitride semiconductor layer on the first nitride semiconductor layer and having a larger bandgap than the first nitride semiconductor layer, a first electrode on the second nitride semiconductor layer and electrically connected to the first nitride semiconductor layer, a second electrode above the first nitride semiconductor layer and electrically connected to the first nitride semiconductor layer, and a gate electrode between the first electrode and the second electrode. A gate field plate electrode is on the gate electrode and electrically connected to the gate electrode. A first field plate electrode is above the second nitride semiconductor layer at a position between the gate field plate electrode and the second electrode, and electrically connected to the first electrode. A second field plate electrode is between the first field plate electrode and the gate field plate electrode and electrically connected to the first electrode. In the device, the distance from the first nitride semiconductor layer to a bottom surface of the second field plate electrode is shorter than a distance from the first nitride semiconductor layer to a bottom surface of a portion of the gate field plate electrode that protrudes the most towards a second electrode side. Additionally, the distance from the first nitride semiconductor layer to the bottom surface of the second field plate electrode is shorter than a distance from the first nitride semiconductor layer to a bottom portion of an end surface of the first field plate electrode on a first electrode side.

Hereinafter, certain example embodiments of the present disclosure will be described with reference to the drawings. It is noted that in the following description, the same or similar components are denoted by identical reference numerals and signs, and that components described once will not be repeatedly elaborated unless occasion demands.

In this specification, a "nitride semiconductor layer" includes a "GaN-based semiconductor". The phrase "GaN-based semiconductor" collectively refers to semiconductor materials comprising gallium nitride (GaN), aluminum nitride (AlN), and/or indium nitride (InN).

In this specification, "undoped" means having an impurity concentration of $2 \times 10^{16}$ cm$^{-3}$ or less.

In this specification, to indicate positional relationships of components, for example, an upward direction in the drawings is described in the text as "upper" or the like, and a downward direction in the drawings is described in the text as "lower" or the like. In this specification, concepts referencing the terms "upper" and "lower" do not necessarily indicate relationships with a gravitational direction.

First Embodiment

A semiconductor device according to a first embodiment includes a first nitride semiconductor layer, a second nitride semiconductor layer, a first electrode, a second electrode, a gate electrode, a gate field plate electrode, a first field plate electrode, and a second field plate electrode. The second nitride semiconductor layer is located on the first nitride semiconductor layer and has a larger bandgap than the first nitride semiconductor layer. The first electrode is located on the second nitride semiconductor layer and electrically connected to the first nitride semiconductor layer. The second electrode is located above the first nitride semiconductor layer and electrically connected to the first nitride semiconductor layer. The gate electrode is located between the first electrode and the second electrode. The gate field plate electrode is located on the gate electrode and electrically connected to the gate electrode. The first field plate electrode is located above the second nitride semiconductor layer and between the gate field plate electrode and the second electrode. The first field plate electrode is electrically connected to the first electrode. The second field plate electrode is located between the first field plate electrode and the gate field plate electrode and electrically connected to the first electrode.

FIG. 1 is a schematic cross-sectional view of the semiconductor device according to the first embodiment. The semiconductor device is a high electron mobility transistor (HEMT) 100 using GaN-based semiconductors.

The HEMT 100 includes a substrate 1, a buffer layer 2, a channel layer 3 (a first nitride semiconductor layer), a barrier layer 4 (a second nitride semiconductor layer), a source electrode 5, a gate electrode 6, a drain electrode 7, a gate field plate electrode 8, a first field plate electrode 9, a second field plate electrode 10, a third field plate electrode 11, and an interlayer insulating layer 12.

The substrate 1 is formed of silicon (Si), for example. Other than silicon, the material of the substrate 1 can be sapphire ($Al_2O_3$) or silicon carbide (SiC), for example.

The buffer layer 2 is disposed on the substrate 1. The buffer layer 2 functions to reduce lattice mismatch between the substrate 1 and the channel layer 3. The buffer layer 2 has a multilayer configuration of aluminum gallium nitride ($Al_WGa_{1-W}N$ (0<W≤1)).

The channel layer 3 is disposed on the buffer layer 2. The channel layer 3 is also referred to as electron transport layer. The channel layer 3 is formed of, for example, undoped aluminum gallium nitride ($Al_XGa_{1-X}N$ (0≤X<1)). More specifically, the channel layer 3 is formed of, for example, undoped gallium nitride (GaN). The thickness of the channel layer 3 is, for example, between 0.1 μm and 10 μm. In the description, a thickness is a dimension of a component, including the channel layer 3, along the layer stacking direction of the channel layer 3 and the barrier layer 4.

The barrier layer 4 is disposed on the channel layer 3. The barrier layer 4 is also referred to as electron supply layer. The barrier layer 4 has a larger bandgap than the channel layer 3. The barrier layer 4 is formed of, for example, undoped aluminum gallium nitride ($Al_YGa_{1-Y}N$ (0<Y≤1, X<Y)). More specifically, the barrier layer 4 is formed of, for example, undoped $Al_{0.25}Ga_{0.75}N$. A thickness of the barrier layer 4 is, for example, 2 nm to 100 nm.

The channel layer 3 and the barrier layer 4 form a heterojunction interface therebetween. A two-dimensional electron gas (2DEG) is formed in the hetero junction interface and becomes a carrier of the HEMT 100.

The first electrode 5 is a source electrode, for example. The source electrode 5 is disposed on the channel layer 3 and the barrier layer 4. The source electrode 5 is electrically connected to the channel layer 3 and the barrier layer 4. The source electrode 5 is, for example, in direct contact with the barrier layer 4.

The source electrode 5 is a metal electrode, for example. The source electrode 5 is a stacked structure of titanium (Ti) and aluminum (Al), for example. Desirably, the source electrode 5 and the barrier layer 4 are in ohmic contact with each other.

The gate electrode 6 is disposed on the channel layer 3 and the barrier layer 4. The gate electrode 6 is electrically connected to the channel layer 3 and the barrier layer 4. The gate electrode 6 is, for example, in direct contact with the barrier layer 4. The gate electrode 6 is interposed between the source electrode 5 and the drain electrode 7.

The gate electrode 6 is formed of titanium nitride (TiN), for example.

A gate insulating film may be interposed between the gate electrode 6 and the barrier layer 4 so as to make the semiconductor device 100 a metal-insulator-semiconductor (MIS) HEMT. The gate insulating layer is formed of, for example, an oxide or oxynitride. The gate insulating layer is formed of, for example, silicon oxide, aluminum oxide, silicon oxynitride, or aluminum oxynitride.

The drain electrode 7 is disposed on the channel layer 3 and the barrier layer 4. The drain electrode 7 is electrically connected to the channel layer 3 and the barrier layer 4. The drain electrode 7 is, for example, in contact with the barrier layer 4.

The drain electrode 7 is a metal electrode, for example. The drain electrode 7 is a stacked structure of titanium (Ti) and aluminum (Al), for example. Desirably, the drain electrode 7 and the barrier layer 4 are in ohmic contact with each other.

A distance between the source electrode 5 and the drain electrode 7 is, for example, 5 μm to 30 μm.

It is noted that in some examples the source electrode 5 and the drain electrode 7 may be in direct contact with the channel layer 3.

The gate field plate electrode 8 is disposed on the gate electrode 6. The gate field plate electrode 8 is connected to the gate electrode 6. The gate field plate electrode 8 reduces electric field concentration of the gate electrode 6 in a lateral direction.

The gate field plate electrode 8 does not have to be a flat conductive film but can be a stepped structure. The gate field plate electrode 8 has a portion separated upward from the gate electrode 6. A side surface of the gate field plate electrode 8 on the second field plate electrode 10 side (the drain electrode 7 side) can be a stepped, non-flat surface.

Figure 2:
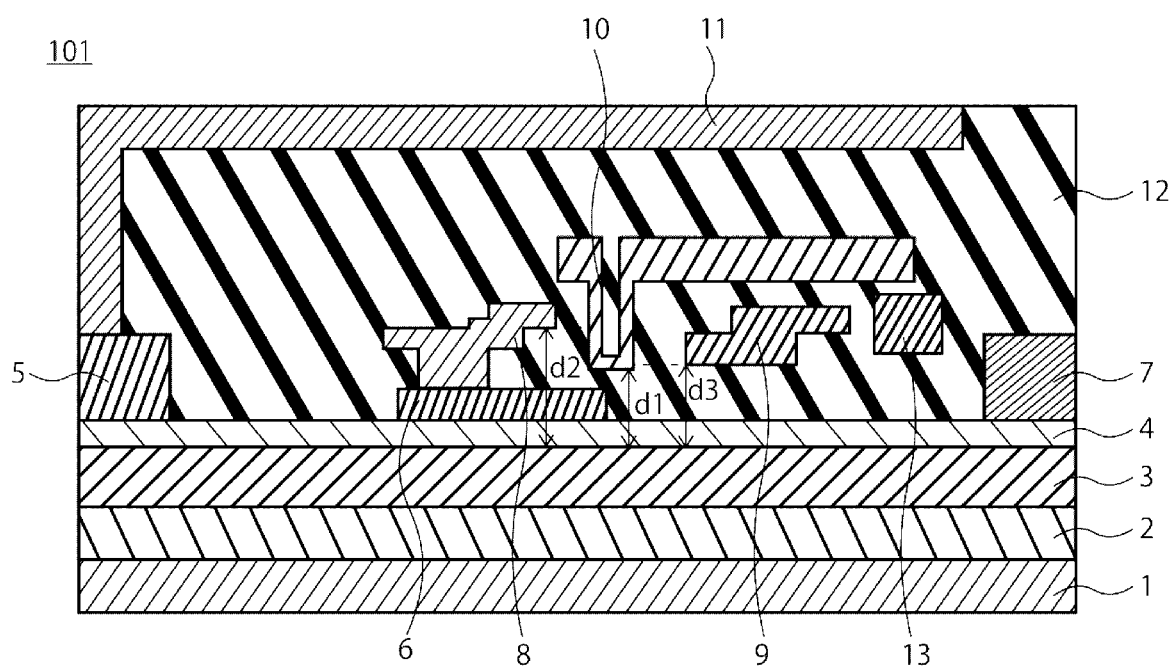
FIG. 2 is a schematic cross-sectional view of the semiconductor device according to an embodiment.

The gate field plate electrode 8 may have 2 steps as illustrated in FIG. 2 or may have 3 or more steps. In the present embodiment, a portion of the gate field plate electrode 8 that protrudes toward the drain electrode 7 has a bottom surface (a surface facing the channel layer 3 side) that is separated upward from the gate electrode 6. When the gate field plate electrode 8 has 3 or more steps, the gate field plate electrode 8 has more than 2 bottom surfaces separated from the gate electrode 6.

In the embodiment illustrated in FIG. 1, the side surface of the upper portion of the gate field plate electrode 8 that protrudes toward the drain electrode 7 (the end surface facing the drain electrode 7 side) is located more to the source electrode 5 side than is the end side surface of the gate electrode 6 on the second field plate electrode 10 side. Moreover, in the embodiment illustrated in FIG. 1, a side surface of the upper portion of the gate field plate electrode 8 that protrudes toward the source electrode 5 (the end surface facing the source electrode 5 side) is located more to the source electrode 5 side than is the end side surface of the gate electrode 6 on the source electrode 5 side.

The first field plate electrode 9 is disposed above the barrier layer 4. The first field plate electrode 9 is separated from the barrier layer 4, and a bottom surface of the first field plate electrode 9 is above the barrier layer 4 and is located, for example, toward the third field plate electrode 11 side away from the barrier layer 4.

The first field plate electrode 9 is electrically connected to the source electrode 5. The first field plate electrode 9 reduces electric field concentration in the lateral direction. In FIG. 1, the first field plate electrode 9 is not in direct contact with the barrier layer 4, and another layer in addition to interlayer insulating layer 12 may be interposed between the barrier layer 4 and the first field plate electrode 9 in some examples. The first field plate electrode 9 is physically separated from the gate electrode 6 and the drain electrode 7. The first field plate electrode 9 in FIG. 1 is located between the gate electrode 6 and the drain electrode 7 but is more to the drain electrode 7 side than is the second field plate electrode 10.

The second field plate electrode 10 is electrically connected to the source electrode 5. The second field plate electrode 10 has a portion extending toward the barrier layer 4 and between the gate field plate electrode 8 and the first field plate electrode 9. The bottommost surface of the second field plate electrode 10 is the bottom surface of the extending portion and is located between the gate field plate electrode 8 and the first field plate electrode 9. The bottom surface of the second field plate electrode 10 is separated from the barrier layer 4.

In the figures, distance d1 represents the distance between the channel layer 3 and the bottommost portion of the second field plate electrode 10, distance d2 represents the distance between the channel layer 3 and the bottom surface of the portion of the gate field plate electrode 8 that protrudes closest to the drain electrode 7 side, and distance d3 represents the distance between the channel layer 3 and a bottom portion of an end of the first field plate electrode 9 on the source electrode 5 side. In this case, preferably, distance d1 is shorter than distance d2, and distance d1 is shorter than distance d3.

Unless the second field plate electrode 10 is provided, electric field concentration is apt to occur at one of an end portion of the gate electrode 6 on the first field plate electrode 9 side, an end portion of the gate field plate electrode 8 on the first field plate electrode 9 side, and/or the gate electrode 6 side of the first field plate electrode 9. Therefore, the second field plate electrode 10 (which is electrically connected to the source electrode 5) is interposed between the gate field plate electrode 8 and the first field plate electrode 9 so as to reduce the electric field concentrations. However, if distance d1 is equal to or longer than distance d2, and distance d1 is equal to or longer than distance d3, the electric field concentration at the end portion of the gate electrode 6 cannot be sufficiently reduced. In view of this, the interlayer insulating layer 12 between the second field plate electrode 10 and the barrier layer 4 is made notably thin, so thin that distance d1 is made shorter than distance d2 and distance d3. Consequently, the electric field concentration at the end portion of the gate electrode 6 can be effectively reduced.

When the end portion of the gate electrode 6 on the drain electrode 7 side is located directly below the bottommost surface of the second field plate electrode 10, provision of the second field plate electrode 10 enables more effective reduction of electric field concentration at the end surface of the gate electrode 6 on the drain electrode 7 side.

When an end surface of the second field plate electrode 10 on the drain electrode 7 side is located closer to the drain electrode 7 side than is an end surface of the first field plate electrode 9 on the source electrode 5 side, electric field concentration at the gate electrode 6 side of the first field plate electrode 9 can be reduced more effectively.

When a distance between the channel layer 3 and an upper end surface of the second field plate electrode 10 is longer than a distance between the channel layer 3 and an upper end surface of the gate field plate electrode 8 on the second field plate electrode 10 side, electric field concentration at an upper end portion of the gate field plate electrode 8 on the drain electrode 7 side can be effectively reduced.

When the distance between the channel layer 3 and the upper end surface of the second field plate electrode 10 is longer than a distance between the channel layer 3 and an upper end surface of the first field plate electrode 9, electric field concentration at an end portion of the first field plate electrode 9 on the source electrode 5 side can be effectively reduced.

The third field plate electrode 11 is electrically connected to the source electrode 5, extends toward the drain electrode 7 direction, and is located above the gate electrode 6. The third field plate electrode 11 reduces electric field concentration in the lateral direction. The third field plate electrode 11 has the same potential as the source electrode 5. The gate electrode 6, the first field plate electrode 9, and the second field plate electrode 10 are located between an extended, upper portion of the third field plate electrode 11 and the second nitride semiconductor layer 4. In the stacking direction of the channel layer 3 and the barrier layer 4, the second field plate electrode 10 is located between the first field plate electrode 9 and the third field plate electrode 11. An end surface of the third field plate electrode 11 on the drain electrode 7 side is located closer to the drain electrode 7 side than is an end surface of the first field plate electrode 9 on the drain electrode 7 side. The end surface of the third field plate electrode 11 on the drain electrode 7 side extends beyond the end surface of the second field plate electrode 10 on the drain electrode 7 side more towards the drain electrode 7 side.

The first to third field plate electrodes in the embodiment are not in direct contact with each other in the cross section illustrated in FIG. 1. The cross section illustrated in FIG. 1 is a plane parallel to a thickness direction of the substrate 1 (a plane perpendicular to a surface of the channel layer 3 on the barrier layer 4 side that includes a line segment extending from the source electrode 5 to the drain electrode 7) and is a plane including the gate electrode 6, the first field plate electrode 9, and the second field plate electrode 10. The source electrode 5 is connected to a source pad in a location not illustrated, and the field plate electrodes described in the embodiment are similarly connected to the source pad, for example.

The interlayer insulating film 12 is formed of, for example, an oxide or nitride. The interlayer insulating film 12 is formed of, for example, silicon oxide ($SiO_2$), silicon nitride (SiN), or high dielectric constant (high-k) material. As an example of the high-k material, hafnium oxide ($HfO_2$) is given.

Types and concentrations of elements in semiconductor layers and semiconductor regions can be specified and measured by, for example, secondary ion mass spectrometry (SIMS) and energy dispersive X-ray spectroscopy (EDX). Relative levels of element concentrations can be determined from levels of carrier concentrations obtained by scanning capacitance microscopy (SCM), for example. Distances such as depths, thicknesses, widths, and intervals of impurity (doped) regions can be obtained by SIMS, for example. Distances such as depths, thicknesses, widths, and intervals of impurity regions can be also obtained from, for example, comparative images of SCM images with atomic probe images or the like.

In comparison to a comparative example lacking the gate field plate electrode 8, the first field plate electrode 9, and the second field plate electrode 10 as described for the first embodiments, electric field concentration at the gate electrode 6 can be reduced.

Second Embodiment

FIG. 2 is a schematic cross-sectional view of a semiconductor device 101 according to the second embodiment. The semiconductor device 101 according to the second embodiment has a configuration in common with the semiconductor device 100 according to the first embodiment except for the following: the gate field plate electrode 8 has multiple steps; the first field plate electrode 9 has multiple steps; a portion of the second field plate electrode 10 that extends toward the barrier layer 4 has a U-shape; the second field plate electrode 10 extends closer to the drain electrode 7 side than does the first field plate electrode 9; and the insulating film 12 is disposed on a fourth field plate electrode 13 between the first field plate electrode 9 and the drain electrode 7. The described embodiments and individual aspects thereof may be adapted and combined with each other in whole or in part as feasible. In the second embodiment, a highly reliable semiconductor device 101 with electric field concentration reduced in the lateral direction can be provided in a manner similar to the first embodiment.

As depicted, the gate field plate electrode 8 may have multiple steps, and the first field plate electrode 9 may have multiple steps. In general, field plate electrodes with multiple steps can further reduce electric field concentration. When the gate field plate electrode 8 has multiple steps, a distance between the channel layer 3 and a bottom surface of an uppermost step of the gate field plate electrode 8 is considered the distance d2. When the first field plate electrode 9 has multiple steps, a distance between the channel layer 3 and a bottom surface of a lowermost step of the first field plate electrode 9 is considered the distance d3.

Even when the portion of the second field plate electrode 10 that extends toward the barrier layer 4 has a U-shape, the extending portion is notably close to the gate electrode 6, so close that d1<d2, and that d1<d3. Consequently, electric field concentration of the gate electrode 6, the gate field plate electrode 8, and the first field plate electrode 9 can be reduced.

In the semiconductor device 101 illustrated in FIG. 2, an end portion of the second field plate electrode 10 on the drain electrode 7 side is located more to the drain electrode 7 side than is the end portion of the first field plate electrode 9 on the drain electrode 7 side. That is, the second field plate electrode 10 is extended toward the drain electrode 7 side, and the fourth field plate electrode 13 is interposed between the first field plate electrode 9 and the drain electrode 7 so that electric field concentration can be reduced and a gate-drain capacitance can be decreased. Moreover, this configuration stabilizes high-speed operation. The fourth field plate electrode 13 is electrically connected to the source electrode 5 and may be connected to the second field plate electrode 10.

Third Embodiment

Figure 3:
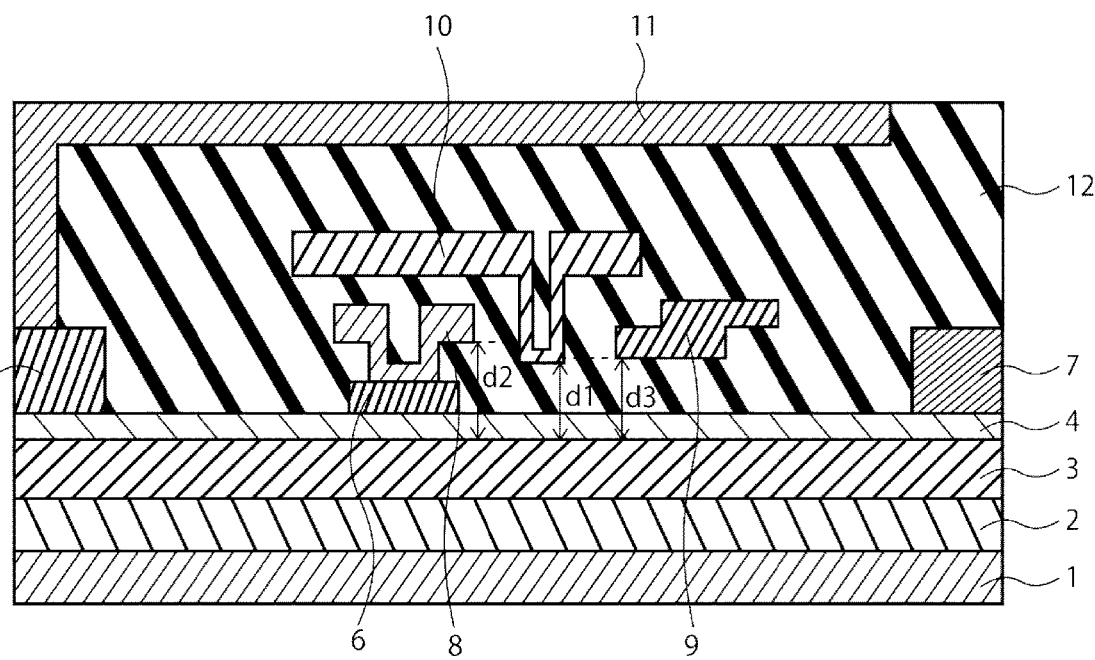
FIG. 3 is a schematic cross-sectional view of the semiconductor device according to an embodiment.

FIG. 3 is a schematic cross-sectional view of a semiconductor device 102 according to the third embodiment. The semiconductor device 102 according to the third embodiment can have a configuration in common with the semiconductor device 100 according to the first embodiment or the semiconductor device 101 according to the second embodiment excepting that the second field plate electrode 10 is more extended toward the source electrode 5 side than in those examples. In general, each of the described embodiments may be combined in whole or in part with the other embodiments. In the third embodiment, the highly reliable semiconductor device 102 with electric field concentration reduced in the lateral direction can be provided in a manner similar to the first embodiment.

In the semiconductor device 102 illustrated in FIG. 3, an end portion of the second field plate electrode 10 on the source electrode 5 side is located more to the source electrode 5 side than is the end portion of the gate field plate electrode 8 on the source electrode 5 side. When the second field plate electrode 10 is extended toward the source electrode 5, the potential is stabilized although a gate-source capacitance may be increased. In some examples, the second field plate electrode 10 may be further extended to the source electrode 5 side and the end of the second field plate electrode 10 may be physically connected to the source electrode 5 or the third field plate electrode 11.

Fourth Embodiment

Figure 4:
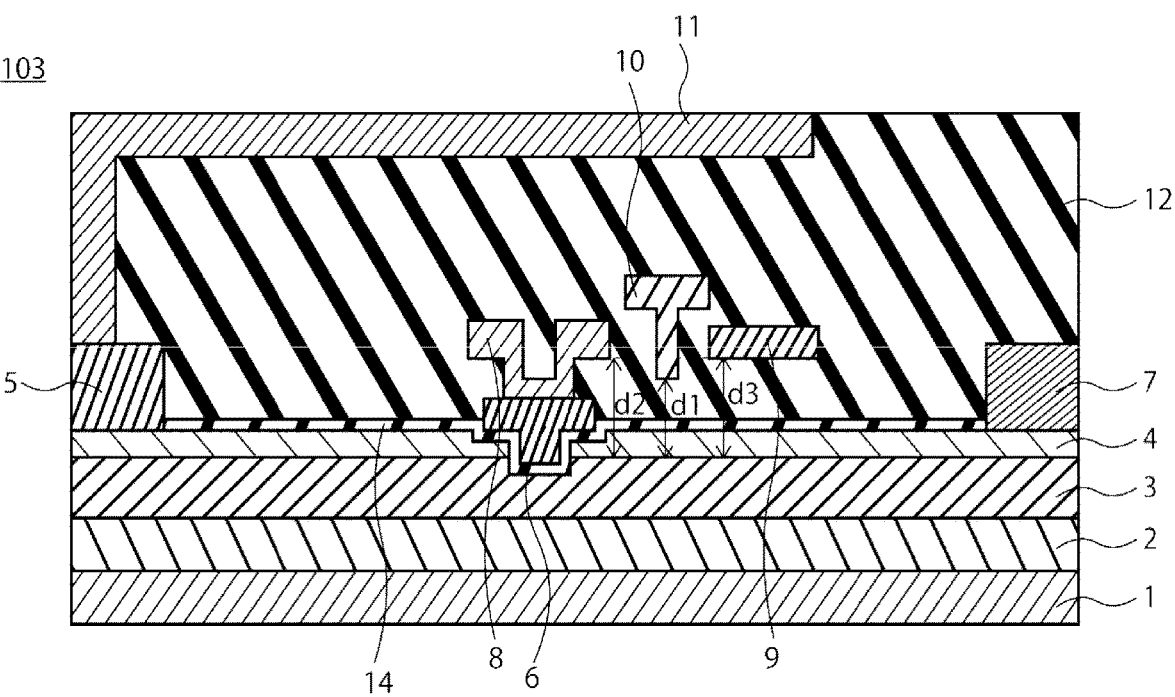
FIG. 4 is a schematic cross-sectional view of the semiconductor device according to an embodiment.

FIG. 4 is a schematic cross-sectional view of a semiconductor device 103 according to the fourth embodiment. The semiconductor device 103 according to the fourth embodiment has, in general, a configuration in common with the semiconductor device 100 according to the first embodiment except for the following: the gate electrode 6 is located in a trench; the trench (a recess) is formed in such a manner that a bottom surface of the gate electrode 6 is located a depth in the channel layer 3; and a gate insulating film 14 interposed between the gate electrode 6 and the barrier layer 4. A bottom surface of the trench is located at depth within the channel layer 3 so that two-dimensional electron gas under the gate electrode 6 disappears or is disrupted. This configuration enables the semiconductor device 103 to implement a normally off operation. Thus, in the fourth embodiment, even with a gate electrode 6 of a different configuration, a highly reliable semiconductor device 103 with electric field concentration reduced in the lateral direction can be provided in a manner similar to that of the other embodiments. As noted, the various described embodiments can, in general, be combined with one another in whole or in part.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
   a first nitride semiconductor layer;
   a second nitride semiconductor layer on a surface of the first nitride semiconductor layer and having a larger bandgap than the first nitride semiconductor layer;
   a first electrode on the second nitride semiconductor layer and electrically connected to the first nitride semiconductor layer;
   a second electrode on the first nitride semiconductor layer and electrically connected to the first nitride semiconductor layer;
   a gate electrode including a planar portion between the first electrode and the second electrode in a first direction parallel to the surface of the first nitride semiconductor layer;
   a gate field plate electrode on the gate electrode and electrically connected to the gate electrode, the gate field plate electrode including a central portion directly above the gate electrode in a second direction that is orthogonal to the surface of the first nitride layer;
   a first field plate electrode above the second nitride semiconductor layer in the second direction at a position that is between the gate field plate electrode and the second electrode in the first direction, the first field plate electrode being electrically connected to the first electrode; and a second field plate electrode including an upper planar portion and a projecting portion that extends from the upper planar portion towards the first nitride semiconductor layer in the second direction, the projecting portion being between the first field plate electrode and the gate field plate electrode in the first direction, and electrically connected to the first electrode, wherein a distance from the first nitride semiconductor layer to a bottom surface of the projecting portion of the second field plate electrode is shorter than a distance from the first nitride semiconductor layer to a bottom surface of an outermost end portion of the gate field plate electrode that protrudes the most in the first direction towards a second electrode side, the distance from the first nitride semiconductor layer to the bottom surface of the projecting portion of the second field plate electrode is greater than zero but shorter than a distance from the first nitride semiconductor layer to a bottom portion of an end surface of the first field plate electrode on a first electrode side, the bottom surface of the projecting portion of the second field plate electrode is separated from the second nitride semiconductor layer by an interlayer insulation layer, and an end portion of the planar portion of the gate electrode is overlapped with the projecting portion of the second field plate electrode in the second direction and between the projecting portion of the second field plate electrode and the second nitride semiconductor layer in the second direction.

2. The semiconductor device according to claim 1, wherein a distance from the first nitride semiconductor layer to an upper end surface of the second field plate electrode is longer than a distance from the first nitride semiconductor layer to an upper end surface of the gate field plate electrode on the second field plate electrode side, and the distance from the first nitride semiconductor layer to the upper end surface of the second field plate electrode is longer than a distance from the first nitride semiconductor layer to an upper end surface of the first field plate electrode.

3. The semiconductor device according to claim 1, further comprising:

a third field plate electrode above the second field plate electrode in the second direction and electrically connected to the first electrode.

4. The semiconductor device according to claim 3, wherein the third field plate electrode physically contacts the first electrode.

5. The semiconductor device according to claim 3, further comprising:

a fourth field plate electrode below the third field plate electrode in the second direction, the fourth field plate electrode being between the first field plate electrode and the second electrode in the first direction and electrically connected to the first electrode.

6. The semiconductor device according to claim 1, further comprising:

a third field plate electrode between the first field plate electrode and the second electrode in the first direction and electrically connected to the first electrode.

7. A semiconductor device, comprising:

a first nitride semiconductor layer having a first surface;

a second nitride semiconductor layer on the first surface of the first nitride semiconductor layer and having a larger bandgap than the first nitride semiconductor layer;

a first electrode above the second nitride semiconductor layer in a first direction orthogonal to the first surface and electrically connected to the first nitride semiconductor layer;

a second electrode above the second nitride semiconductor layer in the first direction and electrically connected to the first nitride semiconductor layer, the second electrode being separated from the first electrode in a second direction parallel to the first surface;

a gate electrode with a planar portion that is between the first electrode and the second electrode in the second direction;

a gate field plate electrode above the planar portion of the gate electrode in the first direction and electrically connected to the gate electrode, the gate field plate electrode including a central portion directly above the planar portion of the gate electrode in the first direction;

a first field plate electrode above the second nitride semiconductor layer in the first direction at a position that is between the gate field plate electrode and the second electrode in the second direction, the first field plate electrode being electrically connected to the first electrode; and a second field plate electrode including an upper planar portion and a projecting portion that extends from the upper planar portion towards the first nitride semiconductor layer in the first direction, the projecting portion being between the first field plate electrode and the gate field plate electrode in the second direction and electrically connected to the first electrode, wherein a distance along the first direction from the first nitride semiconductor layer to the projecting portion of the second field plate electrode is greater than zero but shorter than a distance along the first direction from the first nitride semiconductor layer to an end portion of the gate field plate electrode that protrudes the most along the second direction towards the second electrode, the distance along the first direction from the first nitride semiconductor layer to the projecting portion of the second field plate electrode is shorter than a distance along the first direction from the first nitride semiconductor layer to an end portion of the first field plate electrode on a first electrode side of the first field plate electrode, a lowermost portion of the second field plate electrode in the first direction is separated from the second nitride semiconductor layer in the first direction by a portion of an interlayer insulating film, and an end portion of the planar portion of the gate electrode is overlapped with the projecting portion of the second field plate electrode in the first direction and between the projecting portion of the second field plate electrode and the second nitride semiconductor layer in the first direction.

8. The semiconductor device according to claim 7, further comprising:

a third field plate electrode above the second field plate electrode in the first direction and electrically connected to the first electrode.

9. The semiconductor device according to claim 8, wherein the third field plate electrode physically contacts the first electrode.

10. The semiconductor device according to claim 8, further comprising:
a fourth field plate electrode between the first field plate electrode and the second electrode in the second direction and electrically connected to the first electrode.

11. The semiconductor device according to claim 7, wherein the projecting portion of the second field plate electrode has a U-shaped portion.

12. The semiconductor device according to claim 7, wherein
the gate electrode extends in the first direction through the second nitride semiconductor layer, and
a gate insulating layer is between the gate electrode and the first and second nitride semiconductor layers.

13. The semiconductor device according to claim 7, wherein the gate field plate electrode has a T-shape.

14. The semiconductor device according to claim 13, wherein the projecting portion of the second field plate electrode is directly above, in the first direction, the end portion of the planar portion of the gate electrode.

15. The semiconductor device according to claim 7, wherein the gate electrode is titanium nitride.

16. The semiconductor device according to claim 7, wherein a distance along the first direction from the first nitride semiconductor layer to an uppermost surface of the upper planar portion of the second field plate electrode is greater than a distance along the first direction from the first nitride semiconductor layer to an uppermost surface of the gate field plate electrode.

17. The semiconductor device according to claim 1, wherein the gate field plate electrode has a T-shape.

18. The semiconductor device according to claim 1, wherein the projecting portion of the second field plate electrode is directly above, in the second direction, the end portion of the planar portion of the gate electrode.

19. The semiconductor device according to claim 1, wherein the gate electrode is titanium nitride.

20. The semiconductor device according to claim 1, wherein a distance along the second direction from the first nitride semiconductor layer to an uppermost surface of the upper planar portion of the second field plate electrode is greater than a distance along the second direction from the first nitride semiconductor layer to an uppermost surface of the gate field plate electrode.

* * * * *